(12) United States Patent
Hsieh et al.

(10) Patent No.: US 7,727,818 B2
(45) Date of Patent: Jun. 1, 2010

(54) SUBSTRATE PROCESS FOR AN EMBEDDED COMPONENT

(75) Inventors: Chueh-An Hsieh, Kao-Hsiung (TW); Li-Cheng Tai, Kao-Hsiung Hsien (TW)

(73) Assignee: Advanced Semiconductor Engineering, Inc., Kao-Hsiung (TW)

( * ) Notice: Subject to any disclaimer, the term of this patent is extended or adjusted under 35 U.S.C. 154(b) by 44 days.

(21) Appl. No.: 11/972,633

(22) Filed: Jan. 11, 2008

(65) Prior Publication Data

US 2008/0220566 A1  Sep. 11, 2008

(30) Foreign Application Priority Data

Mar. 9, 2007  (TW) .............................. 96108330 A

(51) Int. Cl.
*H01L 21/00* (2006.01)
(52) U.S. Cl. ............................... 438/125; 257/E21.502
(58) Field of Classification Search ................. 438/125, 438/118, 598, 15, 25, 26, 64, 126; 257/E21.502, 257/E21.503, E21.504, E21.526
See application file for complete search history.

(56) References Cited

U.S. PATENT DOCUMENTS

| 6,503,781 | B2* | 1/2003 | Stephenson et al. ......... 438/127 |
| 7,413,995 | B2* | 8/2008 | Sterrett et al. ............... 438/734 |
| 7,425,464 | B2* | 9/2008 | Fay et al. ..................... 438/107 |
| 2002/0115237 | A1* | 8/2002 | Williams .................... 438/126 |
| 2005/0260790 | A1* | 11/2005 | Goodner et al. ............. 438/106 |
| 2007/0264481 | A1* | 11/2007 | DeSimone et al. .......... 428/220 |

* cited by examiner

*Primary Examiner*—Matthew C Landau
*Assistant Examiner*—Jessica Hall
(74) *Attorney, Agent, or Firm*—Winston Hsu

(57) ABSTRACT

A first dielectric layer is formed on a mold having a surface and protruding components and covers the protruding components. At least one electronic component having an active surface, a back surface, and contacts formed on the active surface is disposed on the first dielectric layer. The active surface is faced to the first dielectric layer, and the contacts are corresponding to the protruding components. A second dielectric layer is formed on the first dielectric layer and a carrier is disposed on the back surface of the electronic component. Openings located corresponding to the contacts are further formed within the first dielectric layer by the protruding components in an imprinting step, such that when the mold is removed, the contacts are exposed from the openings.

14 Claims, 20 Drawing Sheets

SUBSTRATE PROCESS FOR AN EMBEDDED COMPONENT

BACKGROUND OF THE INVENTION

1. Field of the Invention

The present invention relates to a substrate process, and particularly to a substrate process for an embedded component.

2. Description of the Prior Art

FIG. 1 shows a flow chart of a conventional substrate process for an embedded component, including: Step 1 of providing a stage, Step 2 of forming at least an electronic component on the stage, Step 3 of forming a first dielectric layer on the stage, Step 4 of disposing a carrier on the first dielectric layer, Step 5 of removing the stage, Step 6 of reversing the carrier, Step 7 of eliminating residual glue, Step 8 of forming a second dielectric layer on the first dielectric layer, Step 9 of forming a plurality of openings by a microlithography process, and Step 10 of forming a redistribution layer on the second dielectric layer.

Please refer to FIGS. 1 and 2A. First, in Step 1, a stage 110 is provided. One surface 111 of the stage 110 is coated with a glue layer 112. Next, referring to FIGS. 1 and 2B, in Step 2, a plurality of electronic components 210 are disposed on the stage 110. Each electronic component 210 has an active surface 211, a back surface 212, and a plurality of contacts 213. The active surface 211 is faced to the surface 111 of the stage 110. The contacts 213 are formed on the active surface 211. Thereafter, referring to FIGS. 1 and 2C, in Step 3, a first dielectric layer 220 is formed on the stage 110. The first dielectric layer 220 covers the electronic component 210. The first dielectric layer 220 exposes the back surfaces 212 of the electronic components 210 by a planarization step. Thereafter, please refer to FIGS. 1 and 2D. In Step 4, a carrier 230 is disposed on the first dielectric layer 220. The carrier 230 is attached to the first dielectric layer 220 and the back surfaces 212 of the electronic components 210 using an adhesive tape 231. Thereafter, please refer to FIGS. 1 and 2E. In Step 5, the stage 110 is removed. Residual glue 112' remains on the electronic components 210 during the removal of the stage 110 since the electronic components 210 are previously fixed on the stage 110 by the glue layer 112. Thereafter, referring to FIGS. 1 and 2F, in Step 6, the carrier is reversed to allow the active surfaces 211 of the electronic components 210 face up. Thereafter, referring to FIGS. 1 and 2G, in Step 7, the residual glue 112' on the active surfaces 211 of the electronic components 210 is eliminated. Thereafter, referring to FIGS. 1 and 2H, in Step 8, a second dielectric layer 240 is formed on the first dielectric layer 220 and covers the active surfaces 211 of the electronic components 210. Thereafter, referring to FIGS. 1 and 2I, in Step 9, a plurality of openings 241 are formed on the second dielectric layer 240 by a microlithography and etching process to expose the contacts 213 of the electronic components 210. Finally, referring to FIGS. 1 and 2J, in Step 10, a redistribution layer 250 is formed on the second dielectric layer 240 to form a substrate for an embedded component 200. The redistribution layer 250 comprises a plurality of redistribution contacts 251. The redistribution contacts 251 are electrically connected to the contacts 213 of the electronic components 210. However, the conventional substrate process for an embedded component is complicated, and the active surfaces 211 tend to be contaminated by the glue layer 112 when the stage 110 is removed, because the electronic components 210 are previously attached to the stage 110. Furthermore, the openings 241 are formed by a microlithography and etching process, and accordingly the contacts 213 also tend to be contaminated by chemicals or residual chemicals tend to remain on the contacts 213 or the second dielectric layer 240.

SUMMARY OF THE INVENTION

An objective of the present invention is to provide a substrate process for an embedded component comprising steps of follows. First, a mold is provided. A plurality of protruding components are protruded from one surface of the mold. Next, a first dielectric layer is formed on the surface and covers the protruding components. Thereafter, at least an electronic component is disposed on the first dielectric layer. An active surface of the electronic component is faced to the first dielectric layer. A plurality of contacts of the electronic component are formed on the active surface, and the contacts are corresponding to the protruding components. Subsequently, a second dielectric layer is formed on the first dielectric layer. Thereafter, a carrier is disposed on the electronic component and a micro-imprinting step is performed to form a plurality of openings on the first dielectric layer. The openings are corresponding to the contacts of the electronic component. Finally, the mold is removed to form a substrate with an embedded component. The substrate process for an embedded component according to the present invention is easy to practice, and, due to the openings formed by the micro-imprinting step, contamination from residual etchant can be prevented.

In accordance with the substrate process for an embedded component of the present invention, first, a mold is provided. The mold has a surface and a plurality of protruding components protruded from the surface. Next, a first dielectric layer is formed on the surface and covers the protruding components. Thereafter, at least an electronic component is disposed on the first dielectric layer. The electronic component has an active surface, a back surface, and a plurality of contacts. The active surface is faced to the first dielectric layer. The contacts are formed on the active surface. The contacts are corresponding to the protruding components. Subsequently, a second dielectric layer is formed on the first dielectric layer. Thereafter, a carrier is formed on the electronic component. Subsequently, a micro-imprinting step is performed to form a plurality of openings on the first dielectric layer by the protruding components of the mold, and the openings are corresponding to the contacts of the electronic component. Finally, the mold is removed.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
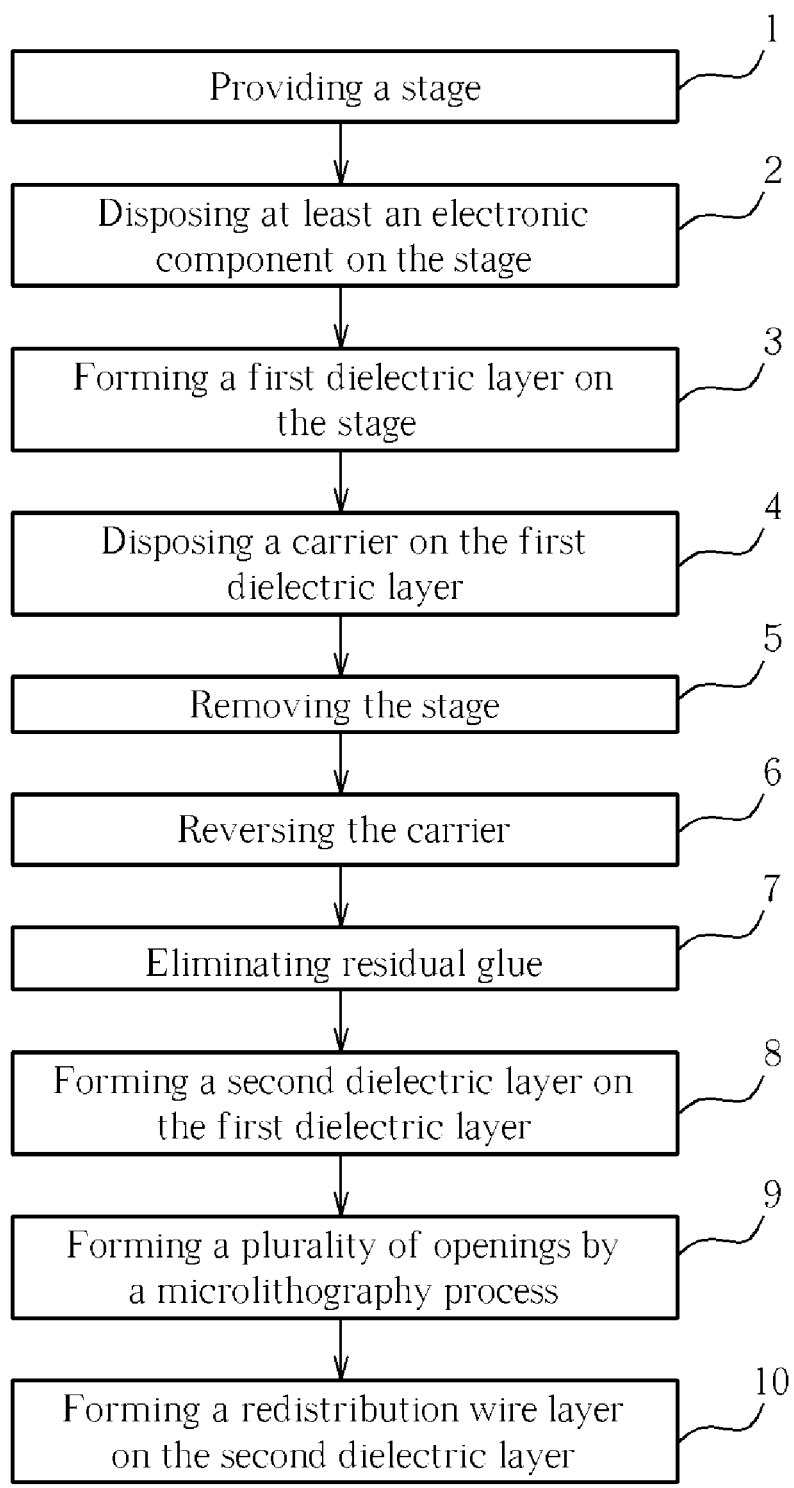
FIG. 1 is a flow chart of a conventional substrate process for an embedded component.
Figure 2A:
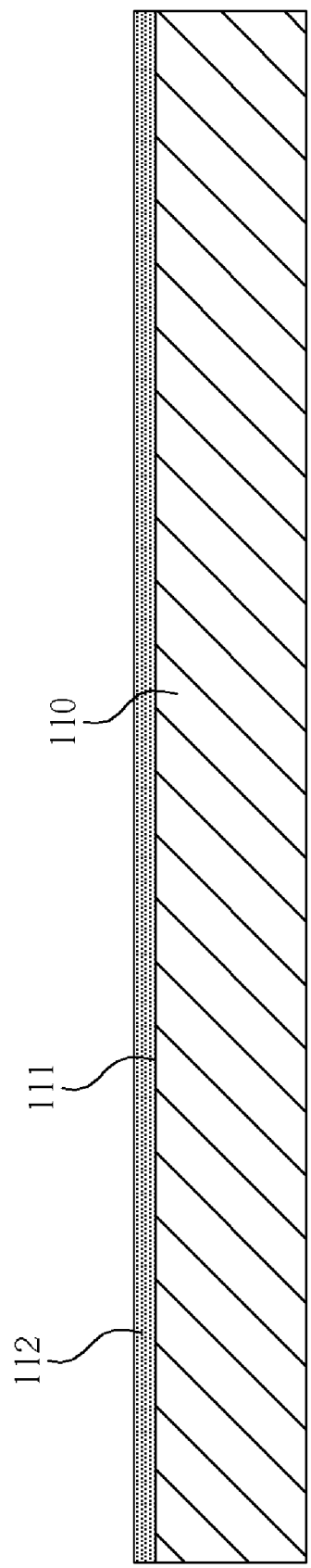
FIGS. 2A through 2J are schematic cross-sectional views showing a conventional substrate process for an embedded component.
Figure 2B:
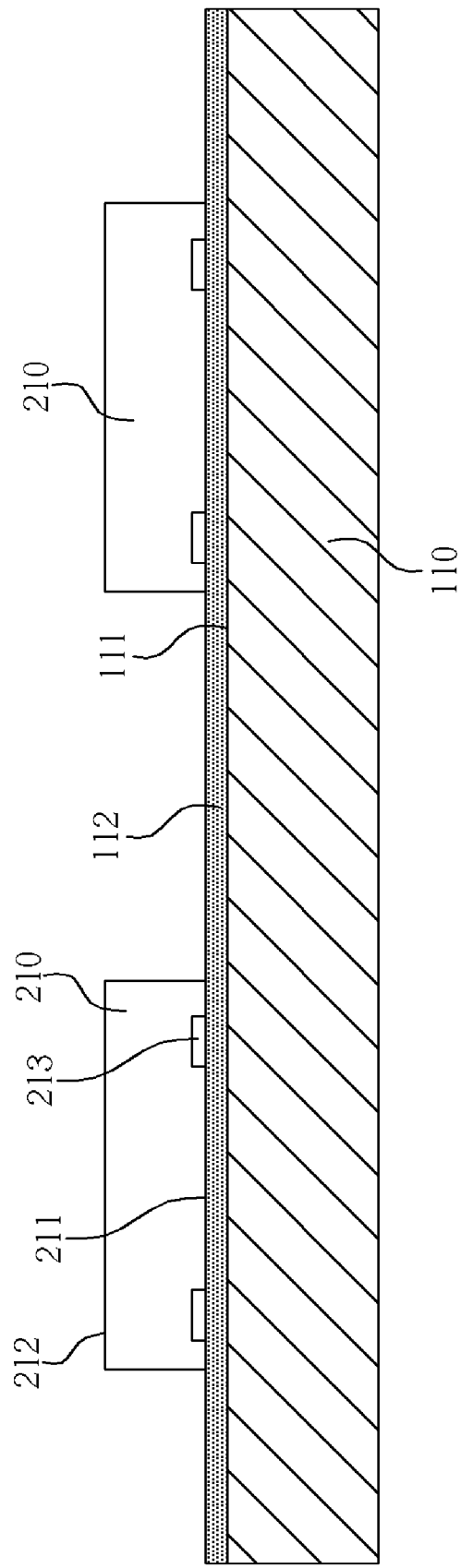
Figure 2C:
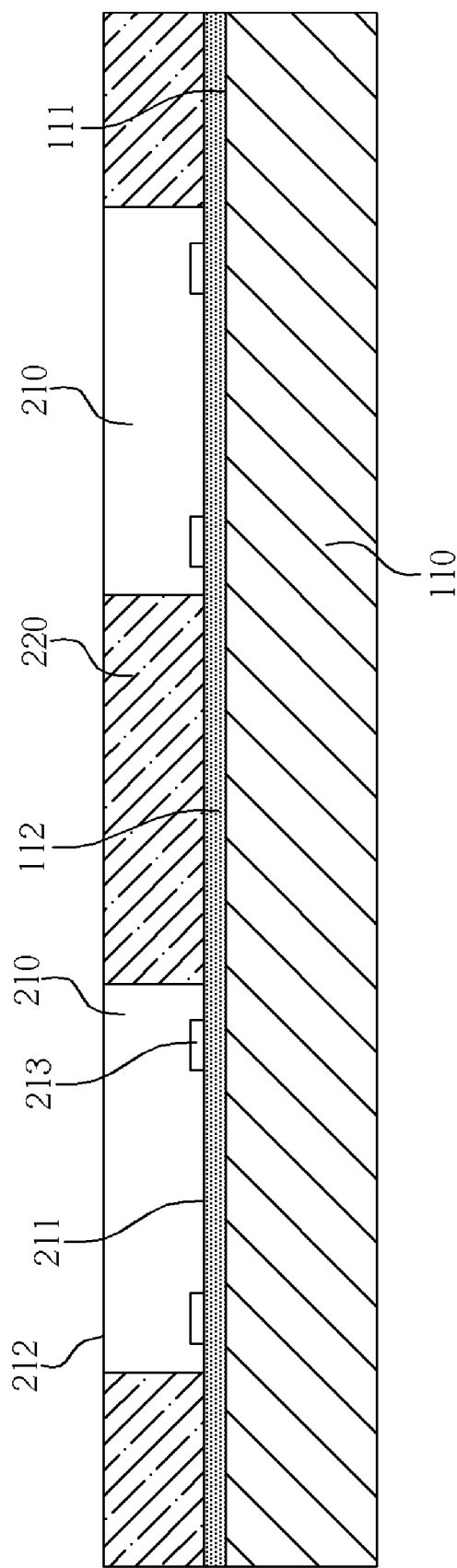
Figure 2D:
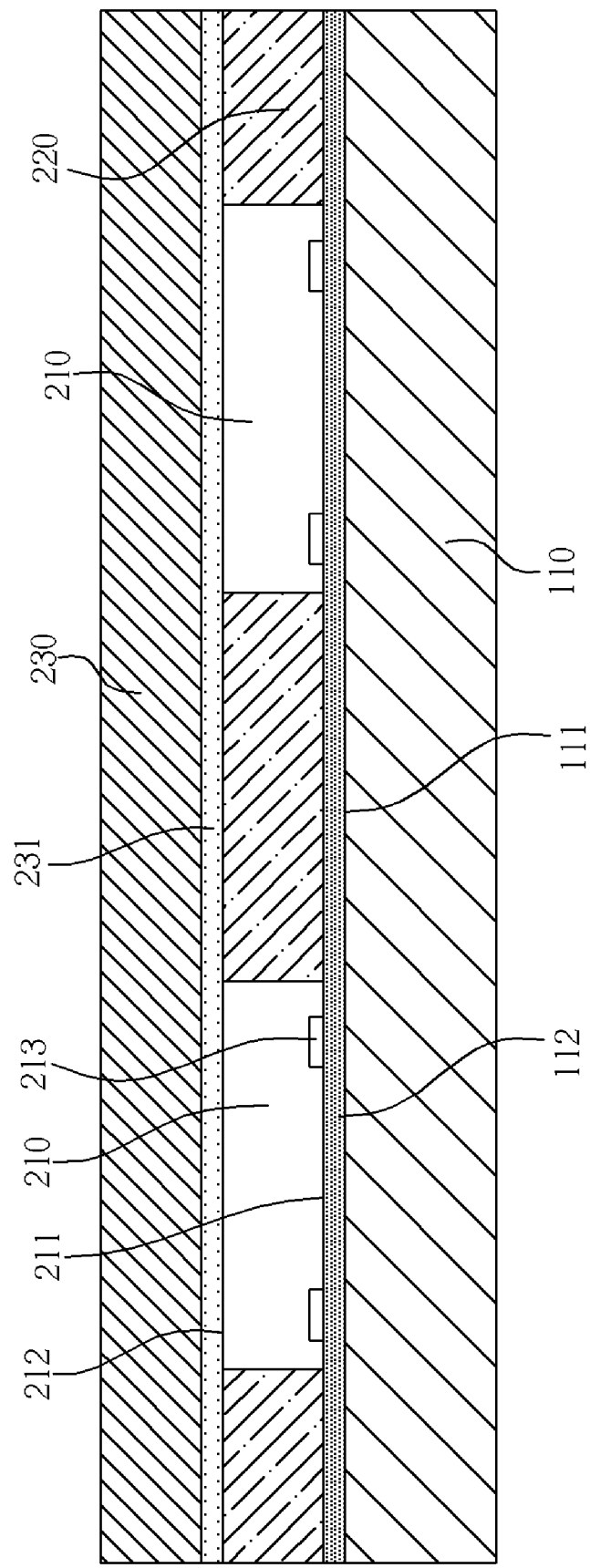
Figure 2E:
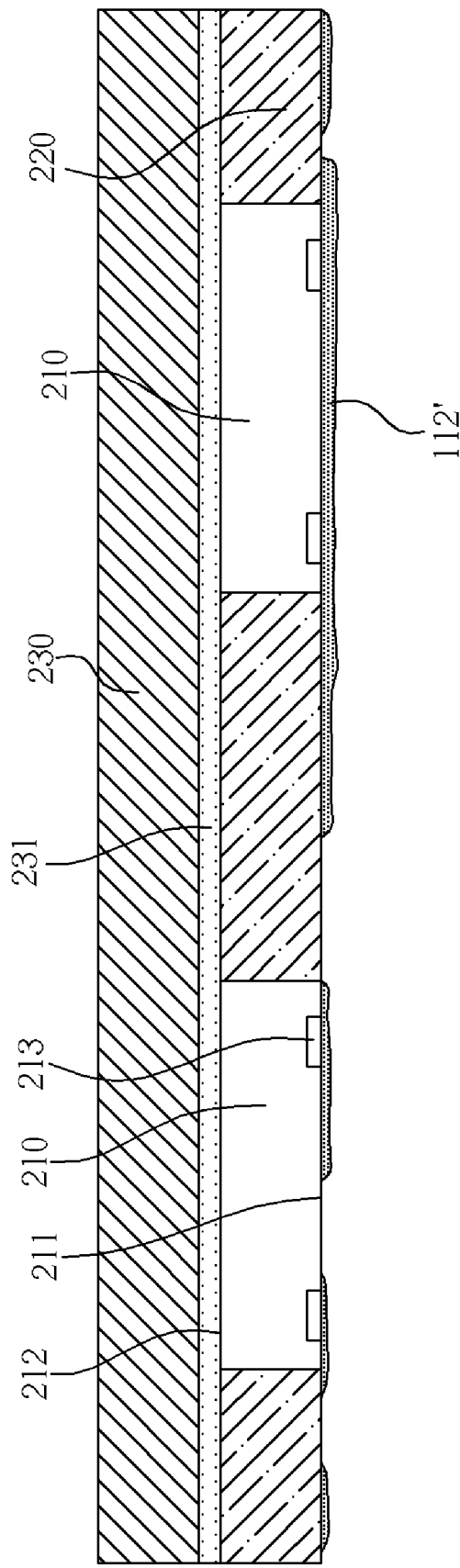
Figure 2F:
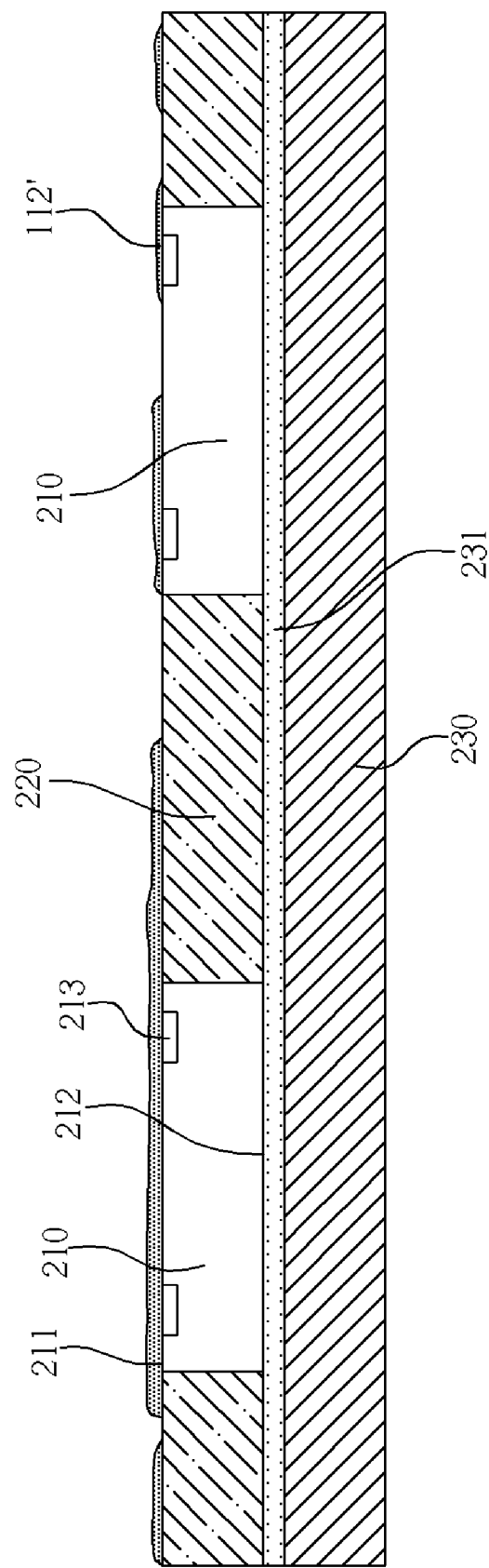
Figure 2G:
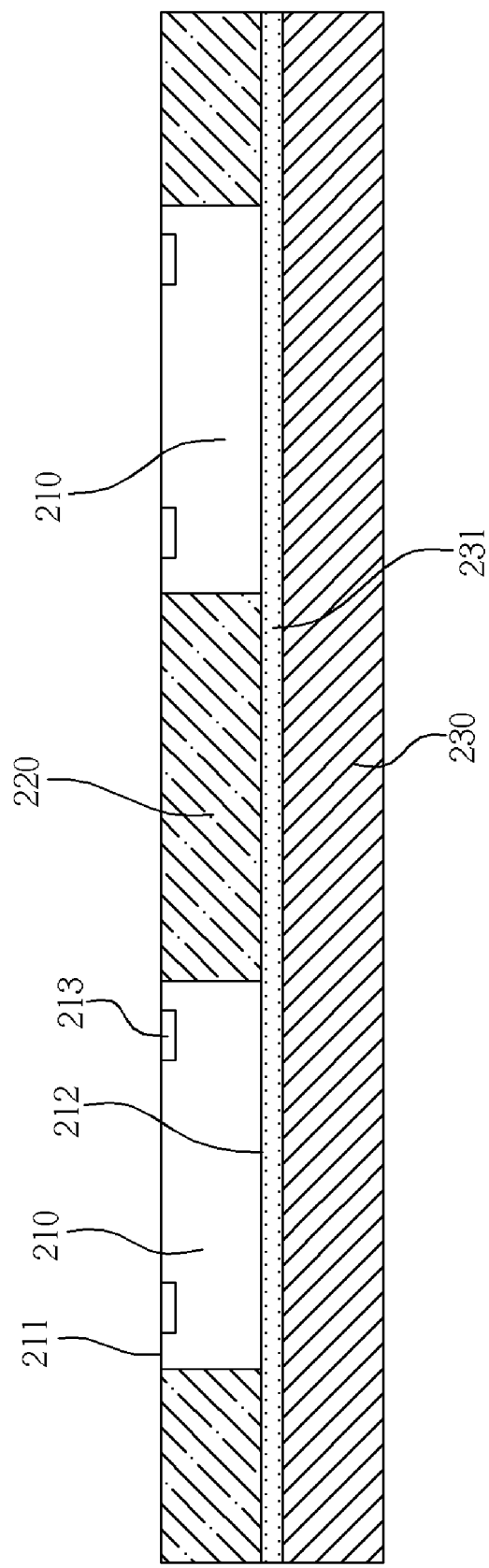
Figure 2H:
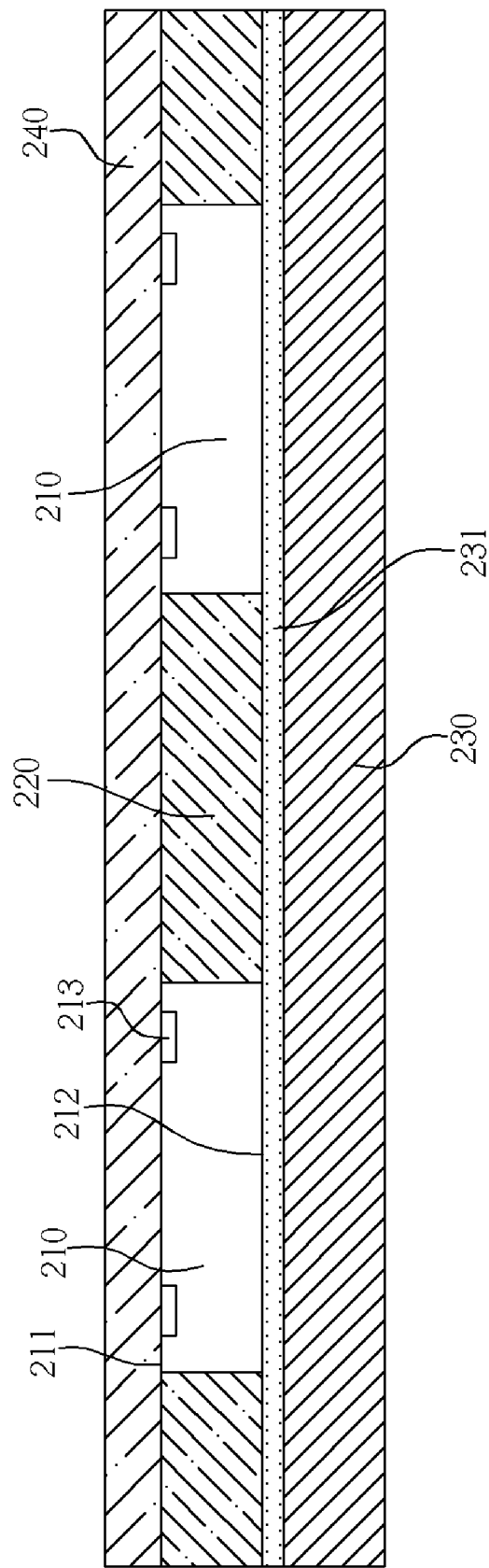
Figure 2I:
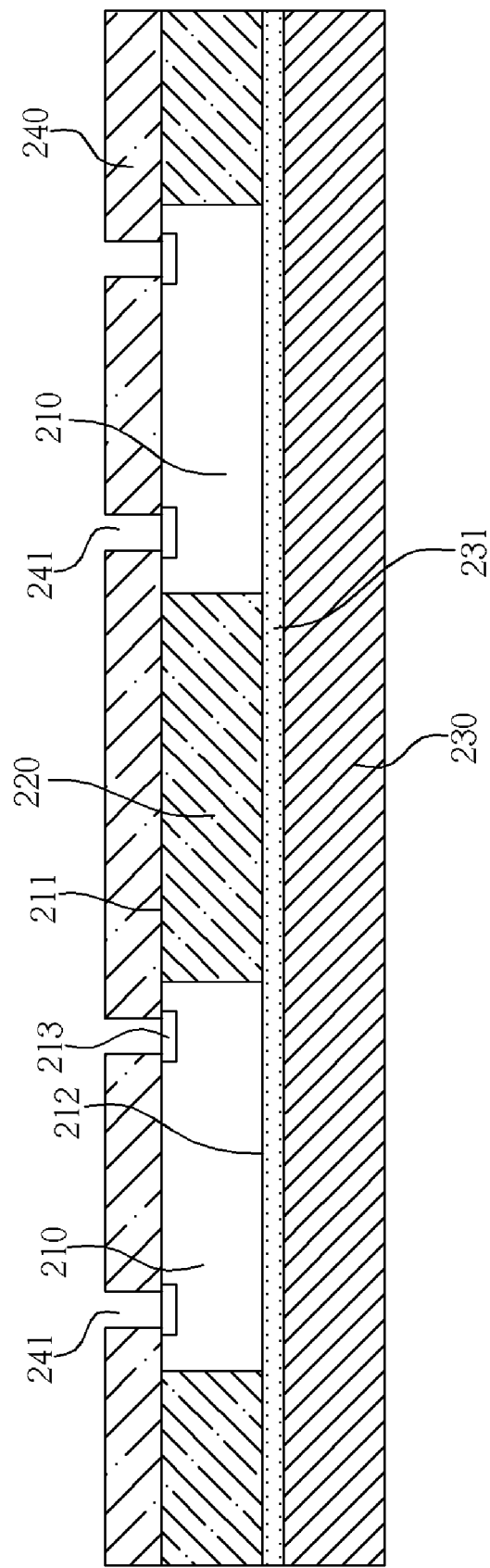
Figure 2J:
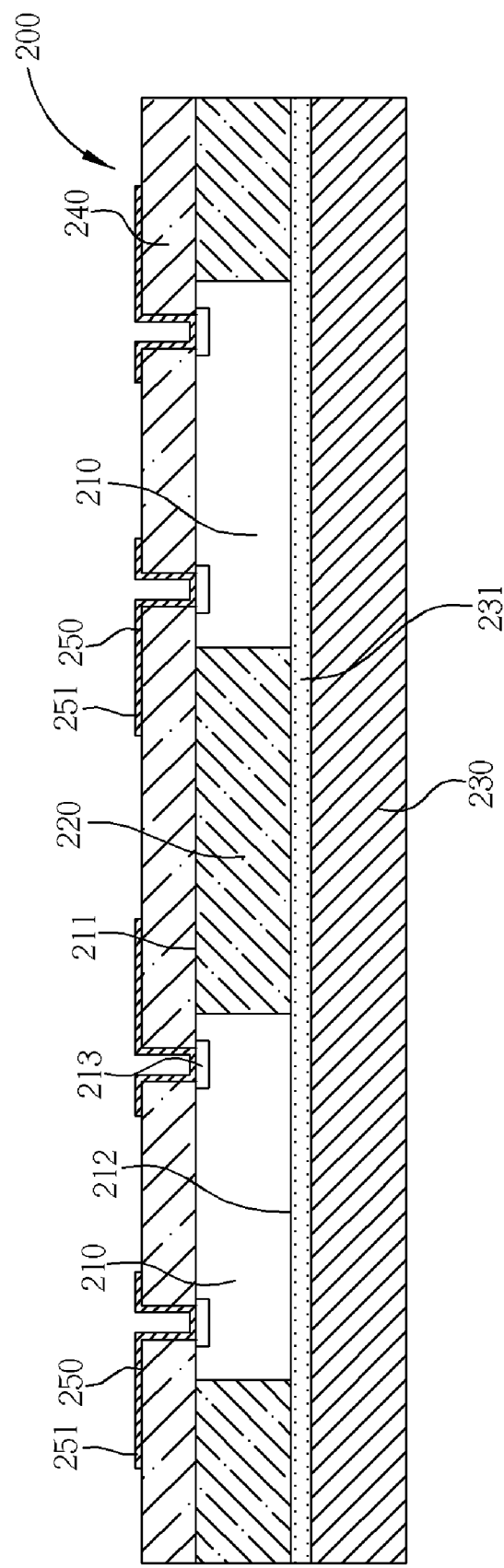
Figure 3:
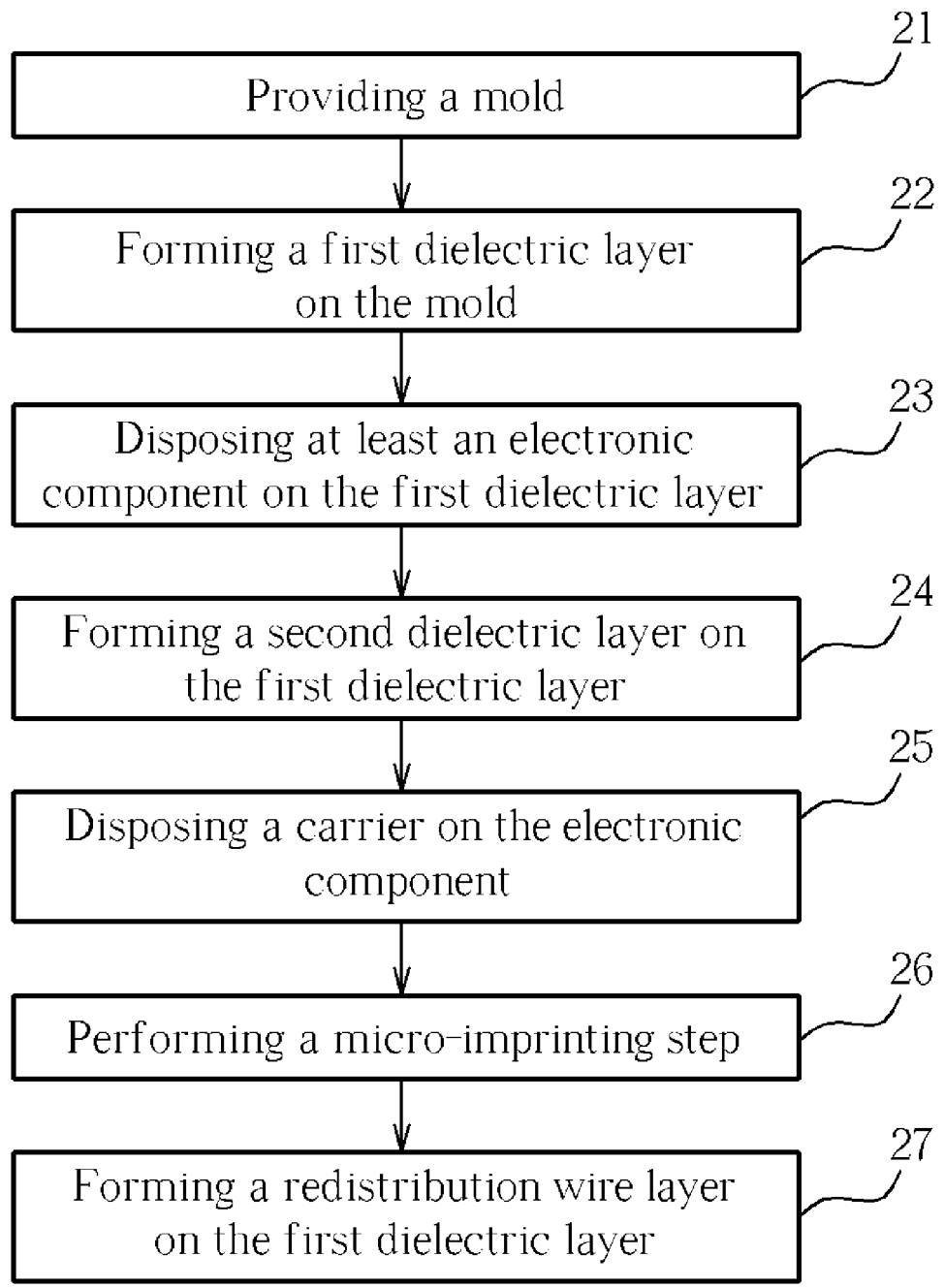
FIG. 3 is a flow chart of an embodiment of the substrate process for an embedded component according to the present invention.

FIG. 3 is a flow chart of an embodiment of the substrate process for an embedded component according to the present invention, including: Step 21 of providing a mold, Step 22 of forming a first dielectric layer on the mold, Step 23 of disposing at least an electronic component on the first dielectric layer, Step 24 of forming a second dielectric layer on the first dielectric layer, Step 25 of disposing a carrier on the electronic component, Step 26 of performing a micro-imprinting step, and Step 27 of forming a redistribution layer on the first dielectric layer.

Figure 4A:
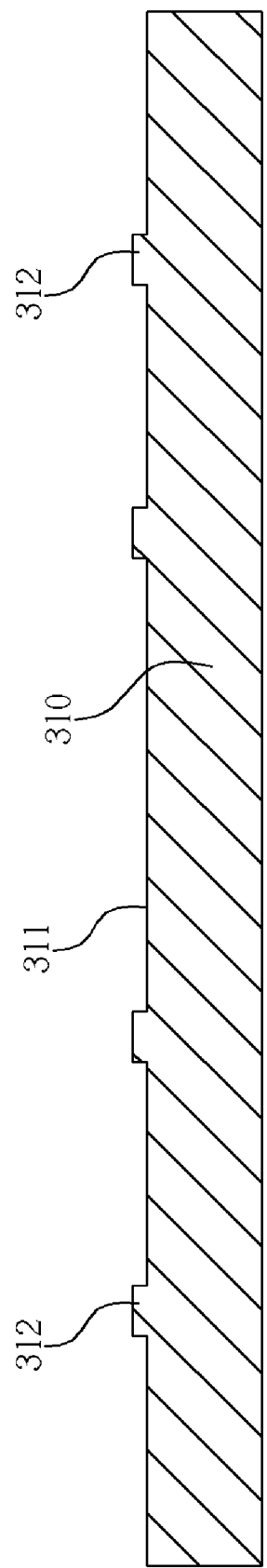
FIGS. 4A through 4H are schematic cross-sectional views showing an embodiment of the substrate process for an embedded component according to the present invention.
Figure 4B:
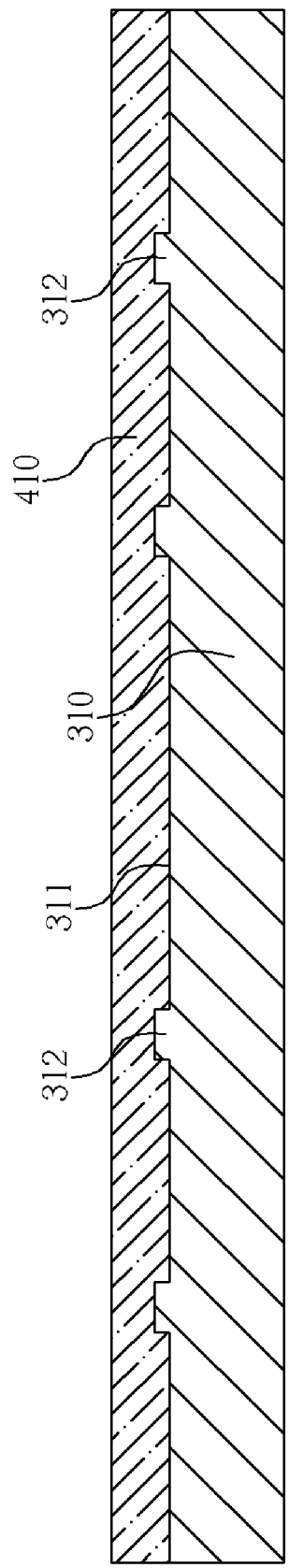
Figure 4C:
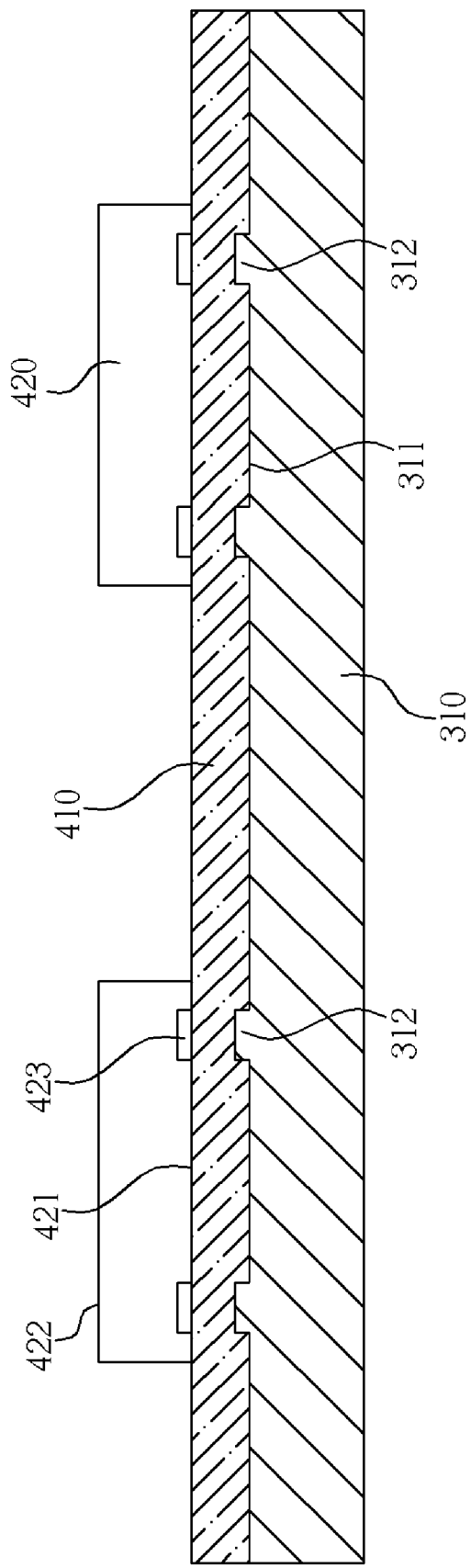
Figure 4D:
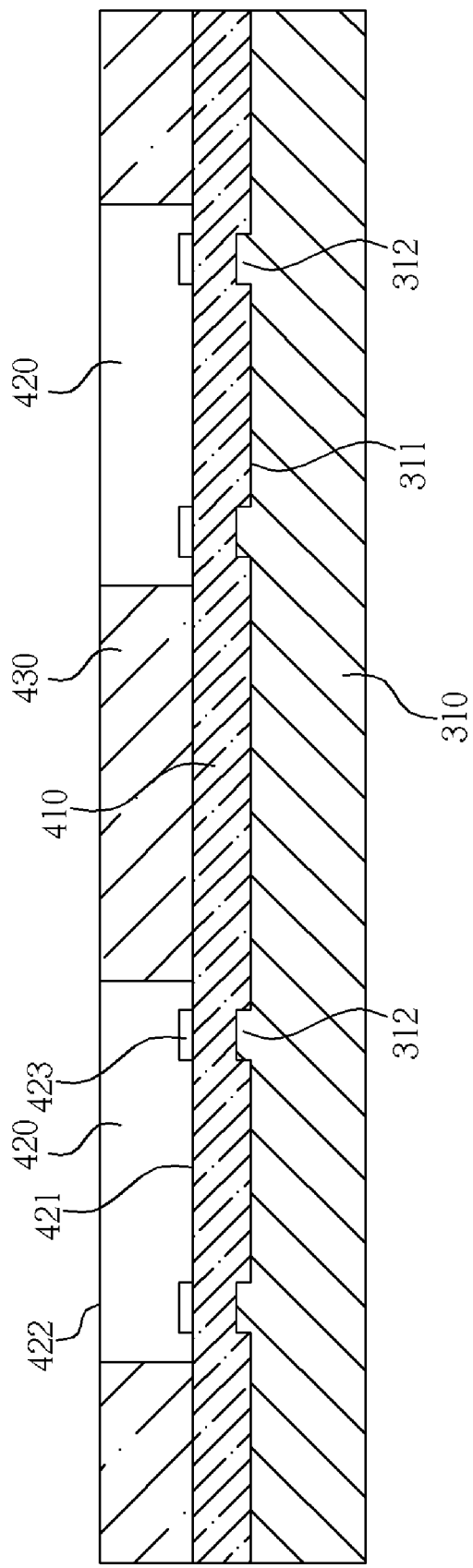

Please refer to FIGS. 3 and 4A. First, in Step 21, a mold 310 is provided. The mold 310 is a transparent material. The mold 310 comprises a surface 311 and a plurality of protruding components 312. The protruding components 312 are formed on the surface 311. Next, referring to FIGS. 3 and 4B, in Step 22, a first dielectric layer 410 is formed on the surface 311 of the mold 310 and covers the protruding components 312. In this embodiment, the first dielectric layer 410 is a B-stage polymeric material, for example, polyimide (PI), polybenzoxazole (PBO), or benzocyclobutene (BCB). Thereafter, please refer to FIGS. 3 and 4C. In Step 23, at least an electronic component 420 is disposed on the first dielectric layer 410. The electronic component 420 may be a chip or a passive component. The electronic component 420 has an active surface 421, a back surface 422, and a plurality of contacts 423. The active surface 421 is faced to the first dielectric layer 410. The contacts 423 are formed on the active surface 421, and the contacts 423 are corresponding to the protruding components 312. Subsequently, please refer to FIGS. 3 and 4D. In Step 24, a second dielectric layer 430 is formed on the first dielectric layer 410. In this embodiment, the second dielectric layer 430 covers the electronic component 420. The second dielectric layer may be an encapsulation material. In this step, a planarization step may be included to expose the back surface 422 of the electronic component 420 from the second dielectric layer 430. Preferably, the second dielectric layer 430 and the back surface 422 of the electronic component 420 are co-planar.

Figure 4E:
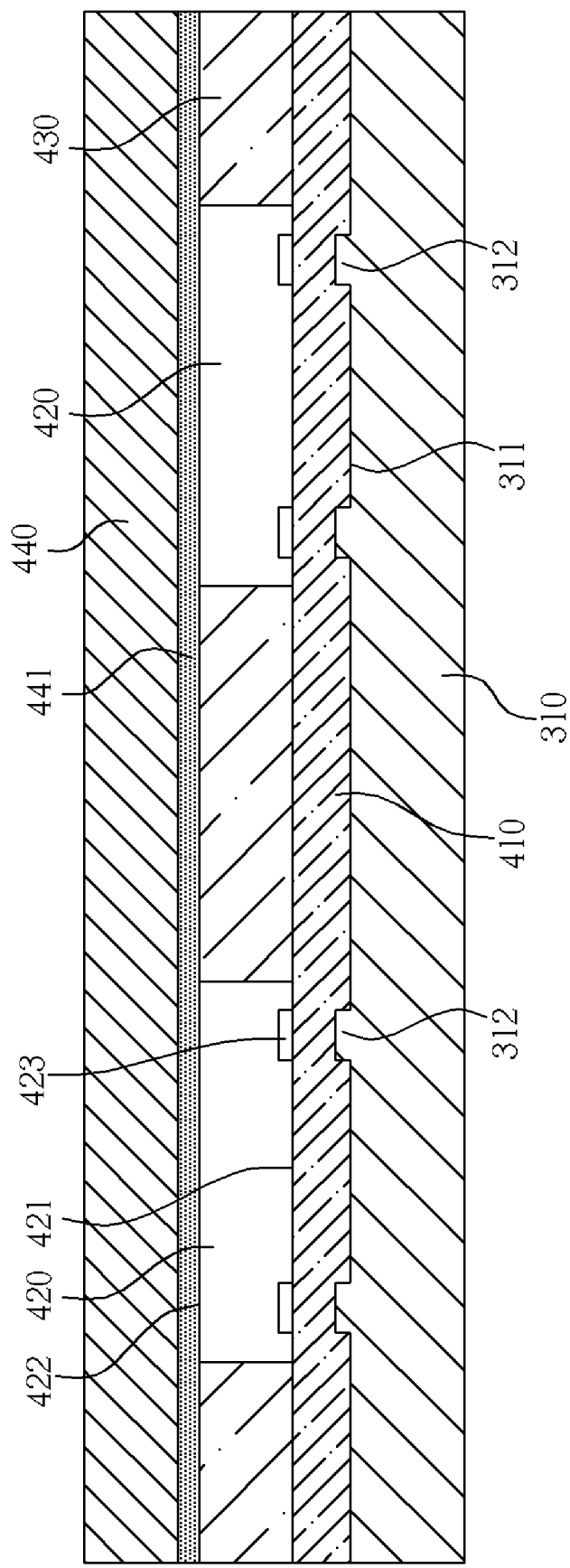
Figure 4F:
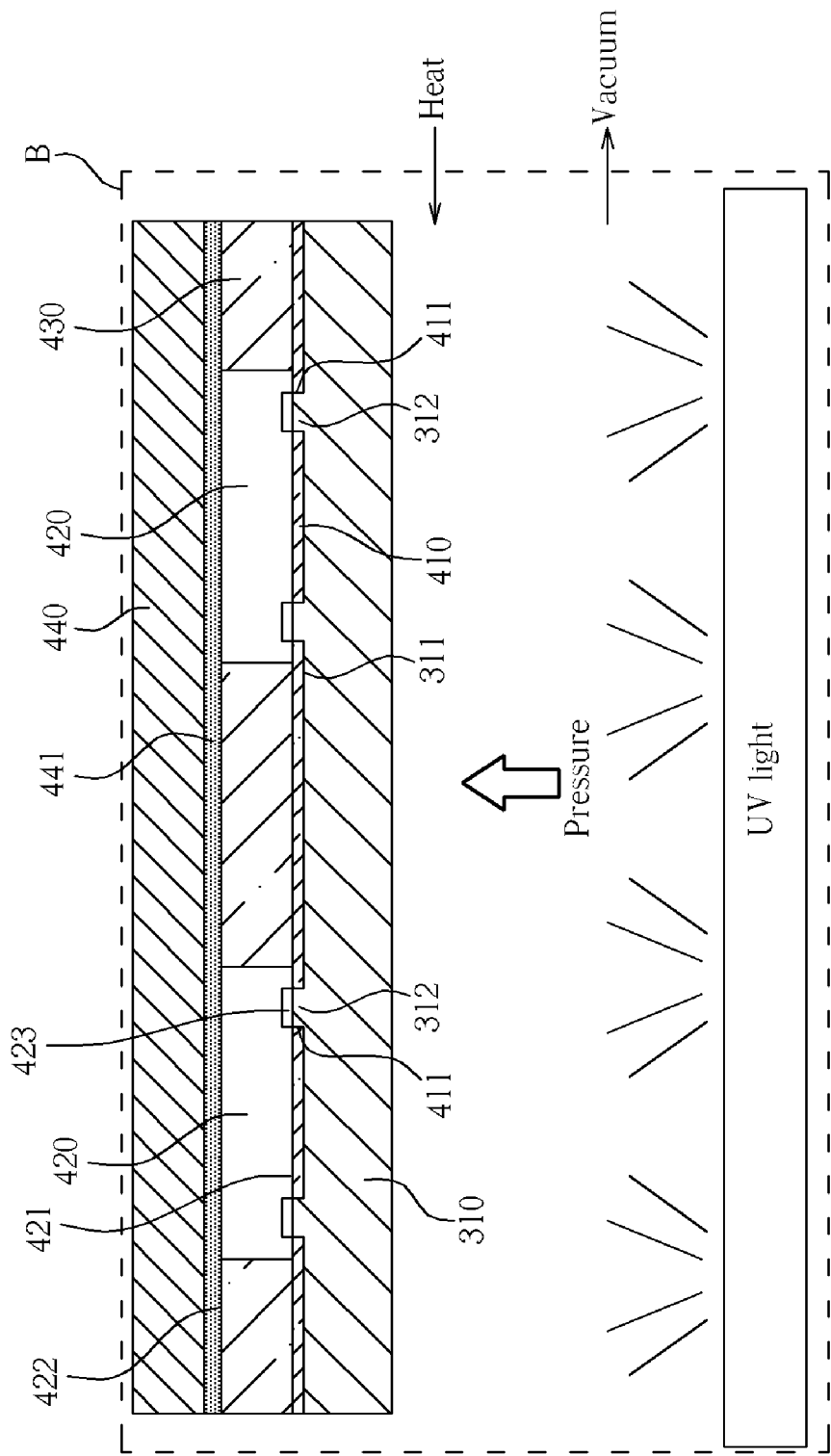
Figure 4G:
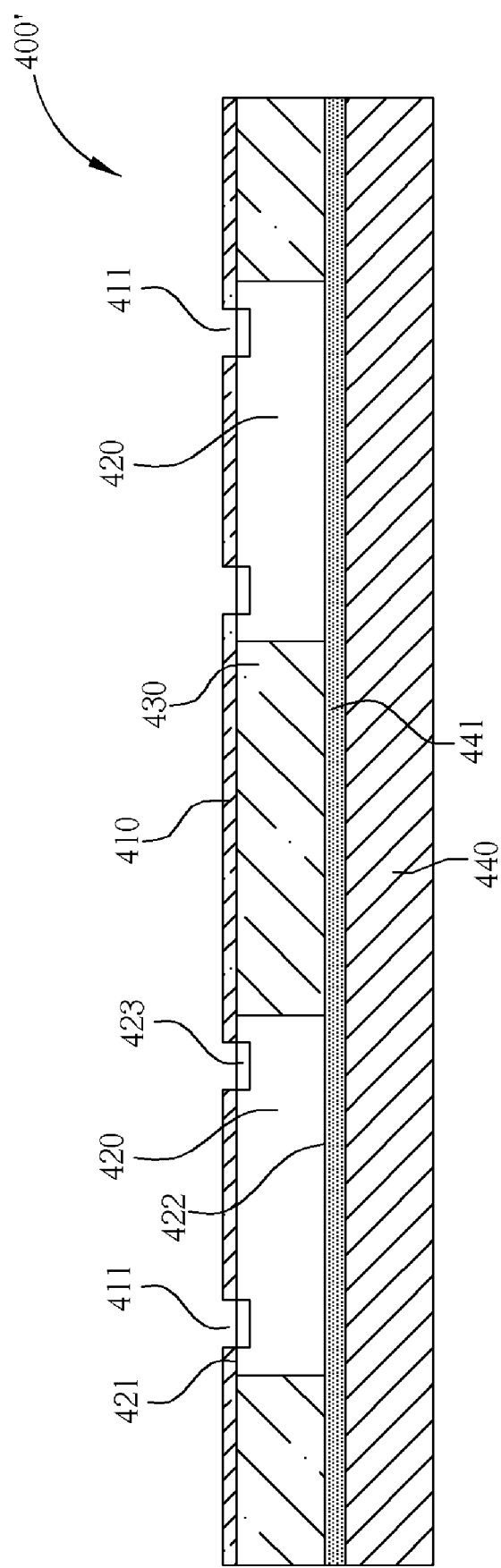

Thereafter, please refer to FIGS. 3 and 4E. In Step 25, a carrier 440 is disposed on the back surface 422 of the electronic component 420. The carrier 440 is one selected from silicon substrate and glass substrate. In this embodiment, the carrier 440 is attached to the back surface 422 of the electronic component 420 and the second dielectric layer 430 using an adhesive tape 441. Thereafter, please refer to FIGS. 3 and 4F. In Step 26, a micro-imprinting step is performed within a vacuum device B to form a plurality of openings 411 on the first dielectric layer 410 by the protruding components 312 of the mold 310. The openings 411 are corresponding to the contacts 423 of the electronic component 420. In addition, pressure, heat, or vacuum may be further applied, and a curing of the first dielectric layer 410 by UV light may be performed, in the micro-imprinting step. Subsequently, referring to FIG. 4G, the mold 310 is removed to form a semifinished substrate with an embedded component 400'. After the mold 310 is removed, the openings 411 are exposed, and the openings 411 expose the contacts 423. Finally, referring to FIGS. 3 and 4H, in Step 27, a redistribution layer 450 is formed on the first dielectric layer 410 to accomplish a substrate for an embedded component 400.

Figure 4H:
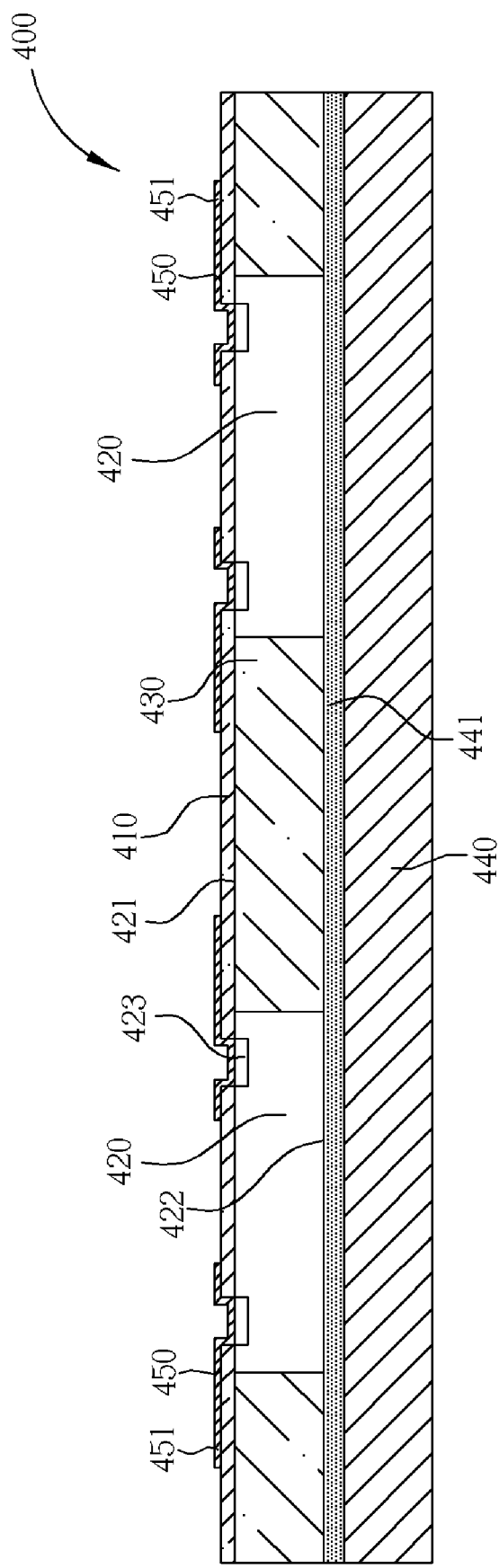

In addition, steps of removing the carrier 440 and the adhesive tape 441 and sawing may be included, thereby to form a chip scale package (CSP) of the substrate for an embedded component 400. In FIG. 4H, the redistribution layer 450 comprises a plurality of redistribution contacts 451. The redistribution contacts 451 are electrically connected to the contacts 423 of the electronic component 420. In addition, residual contaminants remaining on the contacts 423 may be removed by means of laser before the step of forming the redistribution layer 450, such that the redistribution layer 450 may be surely electronically connected to the contacts 423. In the substrate process for an embedded component, since the electronic component 420 is fixed on the mold 310 directly through the first dielectric layer 410, contamination from residual glue can be avoided and the process is easy to practice and convenient. Furthermore, the openings 411 are formed on the first dielectric layer 410 in the micro-imprinting step to expose the contacts 423, such that the contamination of the active surface 421 of the electronic component 420 from residual etchant can be also prevented.

Those skilled in the art will readily observe that numerous modifications and alterations of the device and method may be made while retaining the teachings of the invention.

What is claimed is:

1. A substrate process for an embedded component, comprising:
    providing a mold having a surface and a plurality of protruding components protruded from the surface;
    forming a first dielectric layer on the surface and entirely covering the protruding components;
    disposing at least an electronic component on the first dielectric layer, wherein, the electronic component has an active surface, a back surface, and a plurality of contacts formed on the active surface, the active surface is faced to the first dielectric layer, and the contacts are on the first dielectric layer at positions corresponding to the protruding components and do not contact the protruding components;
    after disposing the at least an electronic component on the first dielectric layer, forming a second dielectric layer on the first dielectric layer;
    disposing a carrier on the back surface of the electronic component;
    performing a micro-imprinting step on the first dielectric layer by applying a pressure to the mold, thereby to form a plurality of openings through the first dielectric layer with the protruding components of the mold and allow the protruding components of the mold to contact the contacts on the active surface of the electronic component through the openings; and
    after performing the micro-imprint step, removing the mold to expose the first dielectric layer and the openings such that the contacts are exposed from the openings.

2. The substrate process for an embedded component of claim 1, wherein the second dielectric layer covers the electronic component.

3. The substrate process for an embedded component of claim 2, further comprising:
    exposing the back surface of the electronic component from the second dielectric layer by a planarization step, so that the carrier is attached to the back surface of the electronic component.

4. The substrate process for an embedded component of claim 3, wherein the second dielectric layer and the back surface of the electronic component are co-planar.

5. The substrate process for an embedded component of claim 1, wherein the first dielectric layer is a B-stage material.

6. The substrate process for an embedded component of claim 1, wherein, the first dielectric layer is cured by a UV light in the micro-imprinting step.

7. The substrate process for an embedded component of claim 1, further comprising:
   forming a redistribution layer on the first dielectric layer, wherein the redistribution layer comprises a plurality of redistribution contacts electrically connecting to the contacts of the electronic component.

8. The substrate process for an embedded component of claim 1, wherein the carrier is a silicon substrate or glass substrate.

9. The substrate process for an embedded component of claim 1, wherein the mold comprises a transparent material.

10. The substrate process for an embedded component of claim 1, wherein the carrier is attached to the back surface of the electronic component using an adhesive tape.

11. The substrate process for an embedded component of claim 1, further comprising:
   performing a step of removing the carrier.

12. The substrate process for an embedded component of claim 1, further comprising:
   performing a step of sawing.

13. The substrate process for an embedded component of claim 1, wherein the electronic component is a semiconductor chip.

14. The substrate process for an embedded component of claim 1, wherein the electronic component is a passive component.

* * * * *